(12) United States Patent
Zhang et al.

(10) Patent No.: US 6,243,155 B1
(45) Date of Patent: Jun. 5, 2001

(54) ELECTRONIC DISPLAY DEVICE HAVING AN ACTIVE MATRIX DISPLAY PANEL

(75) Inventors: Hongyong Zhang; Masayuki Sakakura; Hideaki Kuwabara, all of Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 09/174,468

(22) Filed: Oct. 19, 1998

(30) Foreign Application Priority Data

Oct. 20, 1997 (JP) .................................. 9-306517

(51) Int. Cl.[7] .............................. G02F 1/13; H01L 29/04
(52) U.S. Cl. ............................................. 349/199; 257/57
(58) Field of Search .................. 250/281.1; 349/199; 257/57, 59; 372/50

(56) References Cited

U.S. PATENT DOCUMENTS

| | | | |
|---|---|---|---|
| 4,517,733 | 5/1985 | Hamano | 29/572 |
| 4,940,313 | * 7/1990 | Hamatani | 350/342 |
| 5,315,101 | 5/1994 | Hughes et al. | 250/208.1 |
| 5,349,174 | 9/1994 | Van Berkel et al. | 250/208.1 |
| 5,403,772 | * 4/1995 | Zhang et al. | 437/101 |
| 5,424,244 | * 6/1995 | Zhang et al. | 437/173 |
| 5,589,847 | 12/1996 | Lewis | 345/98 |
| 5,605,847 | * 2/1997 | Zhang | 437/24 |
| 5,650,637 | 7/1997 | Kodaira et al. | 257/72 |
| 5,657,100 | 8/1997 | Yamamoto et al. | 349/41 |
| 5,684,318 | 11/1997 | Ayres et al. | 257/334 |
| 5,717,224 | * 2/1998 | Zhang | 257/57 |
| 5,824,574 | * 10/1998 | Yamazaki et al. | 438/150 |
| 5,917,225 | * 6/1999 | Yamazaki et al. | 257/411 |
| 5,926,238 | * 7/1999 | Inoue et al. | 349/61 |
| 5,962,872 | * 10/1999 | Zhang et al. | 257/66 |
| 5,991,467 | 11/1999 | Kamiko | 382/312 |

FOREIGN PATENT DOCUMENTS

| | | |
|---|---|---|
| 6-18845 | 1/1994 | (JP) . |
| 6-22250 | 1/1994 | (JP) . |
| 6-334910 | * 12/1994 | (JP) . |
| 8-79444 | * 3/1996 | (JP) . |

* cited by examiner

Primary Examiner—William L. Sikes
Assistant Examiner—Tarifur R. Chowdhury
(74) Attorney, Agent, or Firm—Nixon Peabody LLP; Eric J. Robinson

(57) ABSTRACT

A display device using a novel semiconductor device, which includes a pixel matrix, an image sensor, and a peripheral circuit for driving those, that is, which has both a camera function and a display function, and is made intelligent, is provided and a method of manufacturing the same is also provided. One pixel includes a semiconductor device for display and a semiconductor for light reception, that is, one pixel includes semiconductor devices (insulated gate-type field effect semiconductor device) for controlling both display and light reception, so that the display device having a picture reading function is made miniaturized and compact.

53 Claims, 11 Drawing Sheets

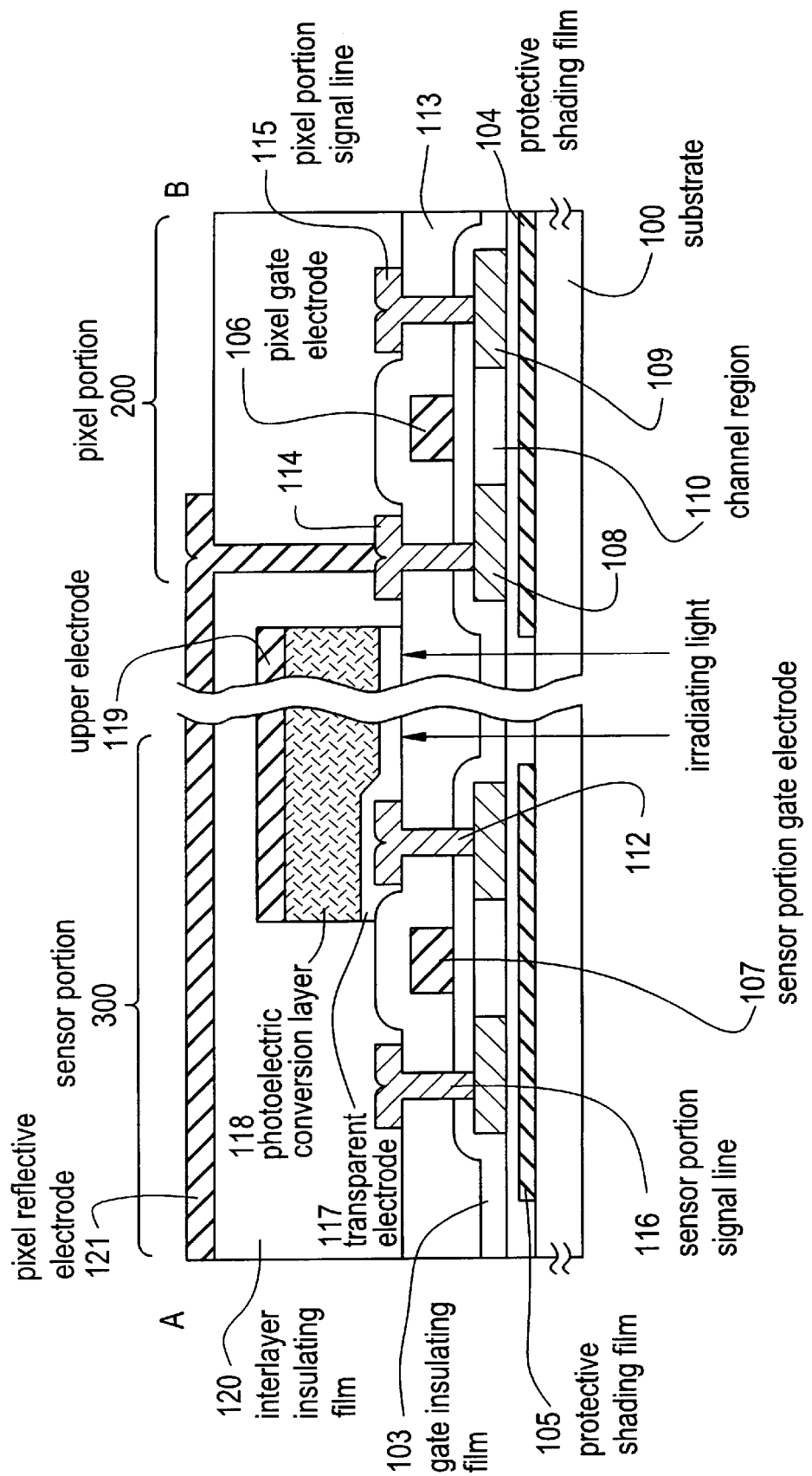

- 115 pixel portion TFT signal line
- 116
- 106 pixel portion TFT gate line
- 104 light shield film for pixel TFT
- 121 pixel electrode
- 107
- 105

- 116 sensor portion TFT signal line
- 115
- 106
- 121
- 118 photoelectric conversion layer
- 105 light shield for sensor TFT
- 104 light shield film for pixel TFT
- 107 sensor portion TFT gate line 300 light receiving sensor portion    200 display pixel portion light receiving sensor portion 300    200 display pixel portion light receiving sensor portion 900    display pixel portion 800 light receiving sensor portion 900    800 display pixel portion

- 1104 shutter
- 1105 operating switch
- 1101 main body
- 1102 light receiving portion
- 1103 stroboscopic lamp

- 1106 display portion

- 1117 display portion

- 1111 main body
- 1112 light receiving sensor portion

ELECTRONIC DISPLAY DEVICE HAVING AN ACTIVE MATRIX DISPLAY PANEL

BACKGROUND OF THE INVENTION

1. Field of the Invention

The present invention relates to a device having an image sensor function and a display function, and particularly to an electronic equipment, such as an active matrix panel with a display portion made of a pixel portion including a plurality of pixel electrodes disposed in matrix, a portable terminal unit with such a display portion, or a personal computer with such a display portion, and also to a method of manufacturing the same.

2. Description of the Related Art

In recent years, a technique of a TFT using polycrystal silicon called a polysilicon TFT has been diligently investigated. As a result, it becomes possible to manufacture a driving circuit, such as a shift register, with polysilicon TFTs, and further, an active matrix type liquid crystal panel in which a pixel portion and a peripheral driving circuit for driving the pixel portion are integrated on the same substrate, has been put to practical use. Thus, the cost of the liquid crystal panel is lowered, the size thereof is reduced, the weight thereof is decreased, and the liquid crystal panel is used as a display portion of various information equipments or portable equipments, such as a personal computer, a portable telephone, a video camera, and a digital camera.

Recently, a pocket-sized small portable information processing terminal unit, which is superior in portability to a note-sized personal computer and is inexpensive, has been put to practical use, and an active matrix type liquid crystal panel is used for its display portion. In such an information processing terminal, although data can be inputted from the display portion by a touch-pen system, it is necessary to connect the terminal with a peripheral device for reading an image, such as a scanner or a digital camera, in order to input character/drawing information on a paper or picture information. For this reason, the portability of the information processing terminal is hindered. Also, an economical load for purchasing a peripheral device is imposed on a user.

An active matrix type display device is used also for a display portion of a TV meeting system, a TV telephone, a terminal for the internet, and the like. Although such a system or terminal is provided with a camera (CCD camera) for photographing an image of a dialogist or a user, a display portion and a reading portion (sensor portion) are separately manufactured and are modularized. Thus, the manufacturing cost becomes high.

SUMMARY OF THE INVENTION

An object of the present invention is to overcome the foregoing problems, and to provide a display device using a novel semiconductor device which includes a pixel matrix, an image sensor, and a peripheral circuit for driving those, that is, includes both a camera function and a display function and is made intelligent.

Another object of the present invention is to inexpensively manufacture a display device using a novel semiconductor device which is made intelligent by causing an image sensor to coordinate with a pixel matrix and a peripheral driving circuit in the structure and manufacturing process.

In order to achieve the above objects, in the present invention, such a structure is adopted that a semiconductor device for display and a semiconductor device for light reception are disposed on the same substrate. A liquid crystal display portion including a pixel electrode and a semiconductor device for display, and a sensor portion including a semiconductor device for light reception are not separately disposed, but a novel device structure which includes the semiconductor device for display and the semiconductor device for light reception in one pixel, that is, as shown in FIGS. 1 and 2, a structure which includes semiconductor devices (insulated gate field effect semiconductor device) for carrying out control of both display and light reception in one pixel, is adopted, so that a display device with a picture reading function is made small and compact.

According to a first aspect of the present invention, an integral-type liquid crystal display, panel with an image sensor function comprises a display portion made of a pixel matrix including at least pixel electrodes in matrix and a first semiconductor device connected to each of the pixel electrodes, and a sensor portion including at least a photoelectric conversion element and a second semiconductor device connected to the photoelectric conversion element, wherein the sensor portion is disposed on the same substrate as the display portion, and light from a back surface of the substrate is received by the sensor portion.

According to a second aspect of the present invention, an integral-type liquid crystal display panel with an image sensor function comprises a display portion made of a pixel matrix including at least pixel electrodes in matrix and a first semiconductor device connected to each of the pixel electrodes, and a sensor portion including at least a photoelectric conversion element and a second semiconductor device connected to the photoelectric conversion element, wherein the sensor portion is disposed on the same substrate as the display portion, the display portion and the sensor portion have the same pixel size, and light from a back surface of the substrate is received by the sensor portion.

According to a third aspect of the present invention, an integral-type liquid crystal display panel with an image sensor function comprises a display portion made of a pixel matrix including at least pixel electrodes in matrix and a first semiconductor device connected to each of the pixel electrodes, and a sensor portion including a photoelectric conversion element and a second semiconductor device connected to the photoelectric conversion element, wherein the sensor portion is disposed on the same substrate as the display portion, the first semiconductor device and the second semiconductor device are disposed in the same matrix, and the pixel electrode connected to the first semiconductor device exists over the second semiconductor device.

According to a fourth aspect of the present invention, an integral-type liquid crystal display panel with an image sensor function comprises a display portion made of a pixel matrix including at least pixel electrodes in matrix and a first semiconductor device connected to each of the pixel electrodes, and a sensor portion including a photoelectric conversion element and a second semiconductor device connected to the photoelectric conversion element, wherein the sensor portion is disposed on the same substrate as the display portion; the photoelectric conversion element includes at least an upper electrode, a photoelectric conversion layer, and a lower electrode, the upper electrode is made of a metal having reflectivity to at least visible light, and the lower electrode is made of a transparent conductive film.

According to a fifth aspect of the present invention, a method of manufacturing an integral-type liquid crystal display panel with an image sensor function which comprises a pixel matrix including pixel electrodes disposed in matrix and a first semiconductor device connected to each of the pixel electrodes, and an image sensor with a light receiving portion including a photoelectric conversion element and a second semiconductor device connected to the photoelectric conversion element, which are disposed on the same substrate as the pixel matrix, the method comprising: a first step of forming the first semiconductor device and the second semiconductor device on the substrate; a second step of forming a lower electrode connected to the second semiconductor device and made of a transparent conductive film; a third step of forming a photoelectric conversion layer on the lower electrode; and a fourth step of forming an upper electrode contacting on the photoelectric conversion layer.

According to a sixth aspect of the present invention, a method of manufacturing an integral-type liquid crystal display panel with an image sensor function which comprises a pixel matrix including pixel electrodes disposed in matrix and a first semiconductor device connected to each of the pixel electrodes, and an image sensor with a light receiving portion including a photoelectric conversion element and a second semiconductor device connected to the photoelectric conversion element, which are disposed on the same substrate as the pixel matrix, the method comprising: a first step of forming the first semiconductor device and the second semiconductor device on the substrate; a second step of forming a first insulating film covering at least the first semiconductor device and the second semiconductor device; a third step of forming a transparent conductive film on the first insulating film; a fourth step of forming a lower electrode connected to the second semiconductor device by patterning the transparent conductive film; a fifth step of forming a photoelectric conversion layer on the lower electrode; and a sixth step of forming an upper electrode contacting on the photoelectric conversion layer.

According to a seventh aspect of the present invention, an integral-type liquid crystal panel with an image sensor function comprises a photoelectric conversion element including a lower electrode, a photoelectric conversion layer formed on the lower electrode, and an upper electrode formed on the photoelectric conversion layer; and a sensor portion including at least one active element connected to the photoelectric conversion element, the sensor portion being disposed on an insulating substrate, wherein the upper electrode is made of a metal having reflectivity to at least visible light, and the lower electrode is made of a conductive film having transparency to at least visible light.

According to an eighth aspect of the present invention, an integral-type liquid crystal display panel with an image sensor function comprises a display portion made of a pixel matrix including at least pixel electrodes in matrix and an active element connected to each of the pixel electrodes, and a sensor portion including at least a photoelectric conversion element and an active element group connected to the photoelectric conversion element, wherein the sensor portion is disposed on the same substrate as the display portion, and light from a back surface of the substrate is received by the sensor portion.

According to a ninth aspect of the present invention, an integral-type liquid crystal display panel with an image sensor function comprises a display portion made of a pixel matrix including at least pixel electrodes in matrix and an active element connected to each of the pixel electrodes, and a sensor portion including at least a photoelectric conversion element and an active element group connected to the photoelectric conversion element, wherein the sensor portion is disposed on the same substrate as the display portion, the display portion and the sensor portion have the same pixel size, and light from a back surface of the substrate is received by the sensor portion.

According to a tenth aspect of the present invention, an integral-type liquid crystal display panel with an image sensor function comprises a display portion made of a pixel matrix including at least pixel electrodes in matrix and an active element connected to each of the pixel electrodes, and a sensor portion including at least a photoelectric conversion element and an active element group connected to the photoelectric conversion element, wherein the sensor portion is disposed on the same substrate as the display portion, the active element and the active element group are disposed in the same matrix, and the pixel electrode connected to the active element exists over the active element group.

According to an eleventh aspect of the present invention, an integral-type liquid crystal display panel with an image sensor function comprises a display portion made of a pixel matrix including at least pixel electrodes in matrix and an active element connected to each of the pixel electrodes, and a sensor portion including at least a photoelectric conversion element and an active element group connected to the photoelectric conversion element, wherein the sensor portion is disposed on the same substrate as the display portion, the photoelectric conversion element includes at least an upper electrode, a photoelectric conversion layer, and a lower electrode, the upper electrode is made of a metal having reflectivity to at least visible light, and the lower electrode is made of a transparent conductive film.

In the eighth to eleventh aspects of the present invention, the active element group includes at least an amplification transistor, a reset transistor, and a selection transistor.

According to a twelfth aspect of the present invention, a method of manufacturing an integral-type liquid crystal display panel with an image sensor function which comprises a pixel matrix including pixel electrodes disposed in matrix and an active element connected to each of the pixel electrodes, and an image sensor with a light receiving portion including a photoelectric conversion element and an active element group connected to the photoelectric conversion element, which are disposed on the same substrate as the pixel matrix, the method comprising: a first step of forming the active element and the active element group on the substrate; a second step of forming a lower electrode connected to the active element group and made of a transparent conductive film; a third step of forming a photoelectric conversion layer on the lower electrode; and a fourth step of forming an upper electrode on the photoelectric conversion layer.

According to a thirteenth aspect of the present invention, a method of manufacturing an integral-type liquid crystal display panel with an image sensor function which comprises a pixel matrix including pixel electrodes disposed in matrix and an active element connected to each of the pixel electrodes, and an image sensor including a photoelectric conversion element and an active element group connected to the photoelectric conversion element, which are disposed on the same substrate as the pixel matrix, the method comprising: a first step of forming the active element and the active element group on the substrate; a second step of forming a first insulating film covering at least the active element and the active element group; a third step of forming a transparent conductive film on the first insulating film; a fourth step of forming a lower electrode connected to the active element group by patterning the transparent conductive film; a fifth step of forming a photoelectric conversion layer on the lower electrode; and a sixth step of forming an upper electrode contacting on the photoelectric conversion layer.

In the twelfth aspect or thirteenth aspect of the present invention, the active element group includes at least an amplification transistor, a reset transistor, and a selection transistor.

BRIEF DESCRIPTION OF THE DRAWINGS

In the accompanying drawings:

FIG. 1 is a sectional view of a pixel of the present invention;

DETAILED DESCRIPTION OF THE PREFERRED EMBODIMENTS

Figure 3:
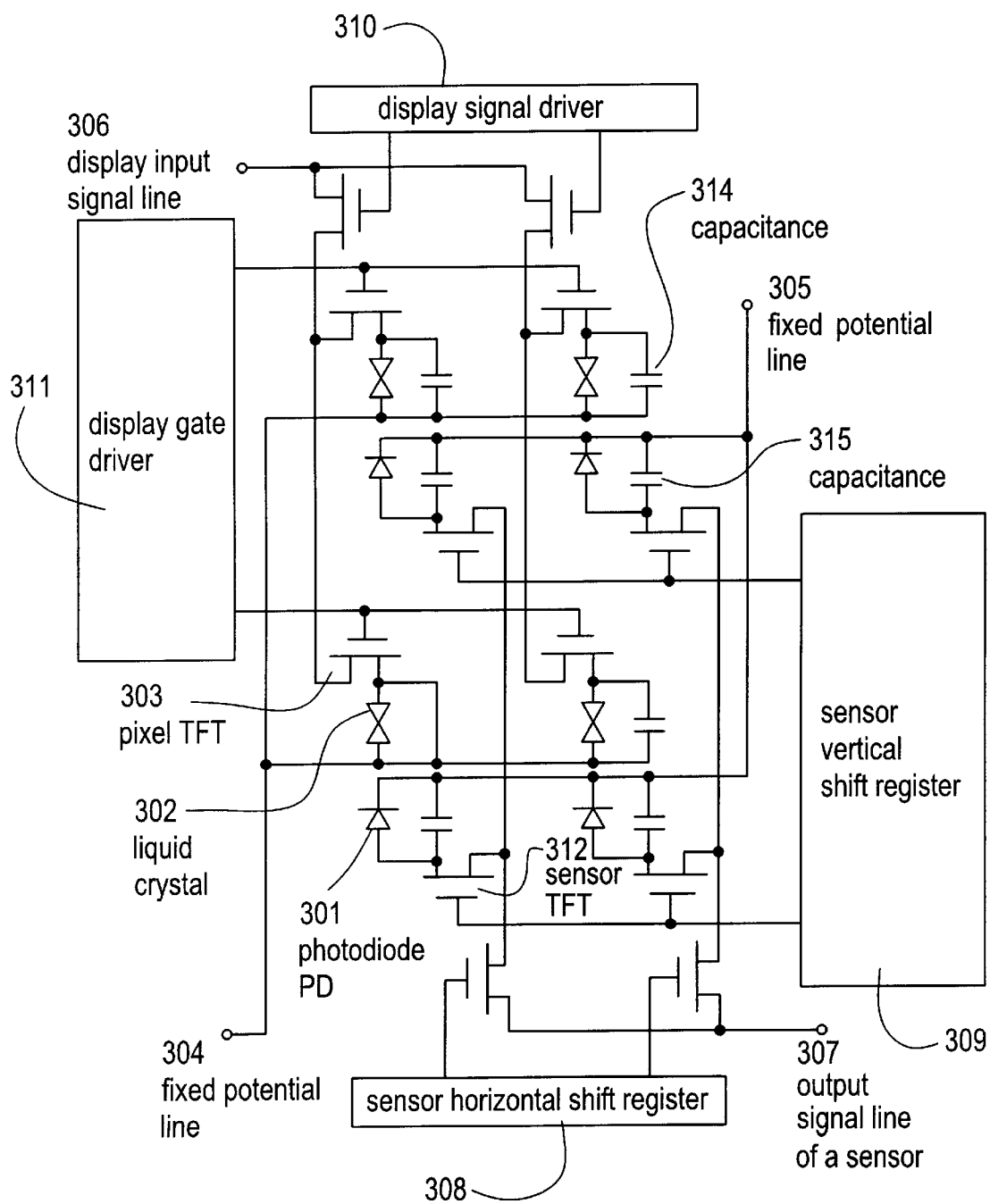
FIG. 3 is a circuit diagram of the present invention.
Figure 4A:
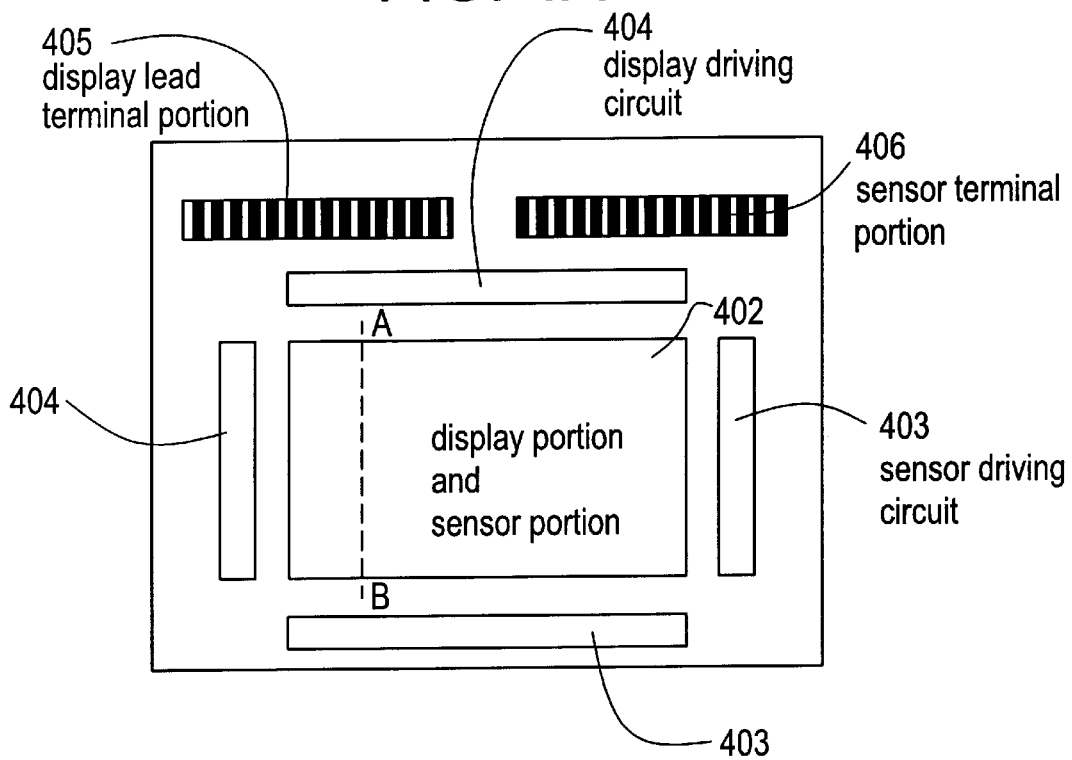
FIGS. 4A and 4B are views of the entire of a liquid crystal panel.
Figure 4B:
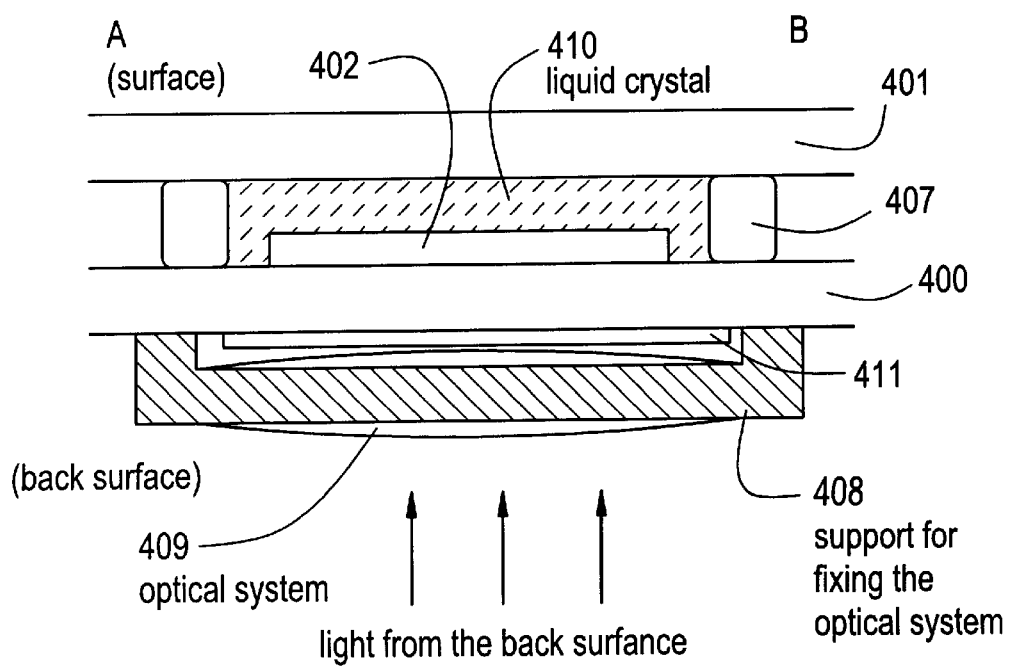

First, a typical mode using the present invention will be described below. In the present invention, as shown in FIG. 1, such a novel element structure is adopted that one pixel includes one semiconductor device (TFT) for display and at least one semiconductor device (TFT) for light reception. A device is constructed such that a potential is applied to a liquid crystal oriented by an oriented film formed on a reflective electrode of this element so that display is made on a liquid crystal display surface, and a sensor portion reads a light signal incident on the back surface of the liquid crystal display surface so that a picture is taken in. The panel structure of this invention is shown in FIGS. 4A and 4b. FIG. 3 is a view showing a circuit diagram of the panel of the present invention simply.

As shown in FIG. 4A, a liquid crystal panel has such a panel arrangement that a sensor driving circuit 403 for driving a sensor portion and a display driving circuit 404 for driving a display portion are provided around a display portion and sensor portion 402.

In the present invention, such a system is adopted that the sensor portion reads light signal data incident on the back surface of a liquid crystal display surface, stores the data in an external storage device or the like connected to a sensor terminal portion 406, the data are processed for picture display, and then, the data are inputted from a display lead terminal portion 405, so that a picture is displayed onto the display portion 402. Such a structure may be adopted that a memory circuit or the like is formed on the same substrate, so that these systems are carried out on the same substrate. Moving pictures or still pictures taken in by the sensor portion are displayed on the liquid crystal panel almost in realtime. Moreover, such a structure may be adopted that data from the outside of the device can be displayed on the display portion.

FIG. 4B is a simplified view of a sectional structure taken along line A–B in FIG. 4A. An element substrate 400 is bonded to an opposite substrate 401 through a seal material 407, and a liquid crystal material 410 is held between the substrates. A picture is provided to a user by using light incident on the liquid crystal display surface.

In the present invention, the sensor portion senses a light signal having passed through an optical system 409 attached to the back surface, a color filter 411, and further the substrate 400. Thus, it is preferable to use the substrate 400 having extremely excellent transparency to visible light.

Figure 2A:
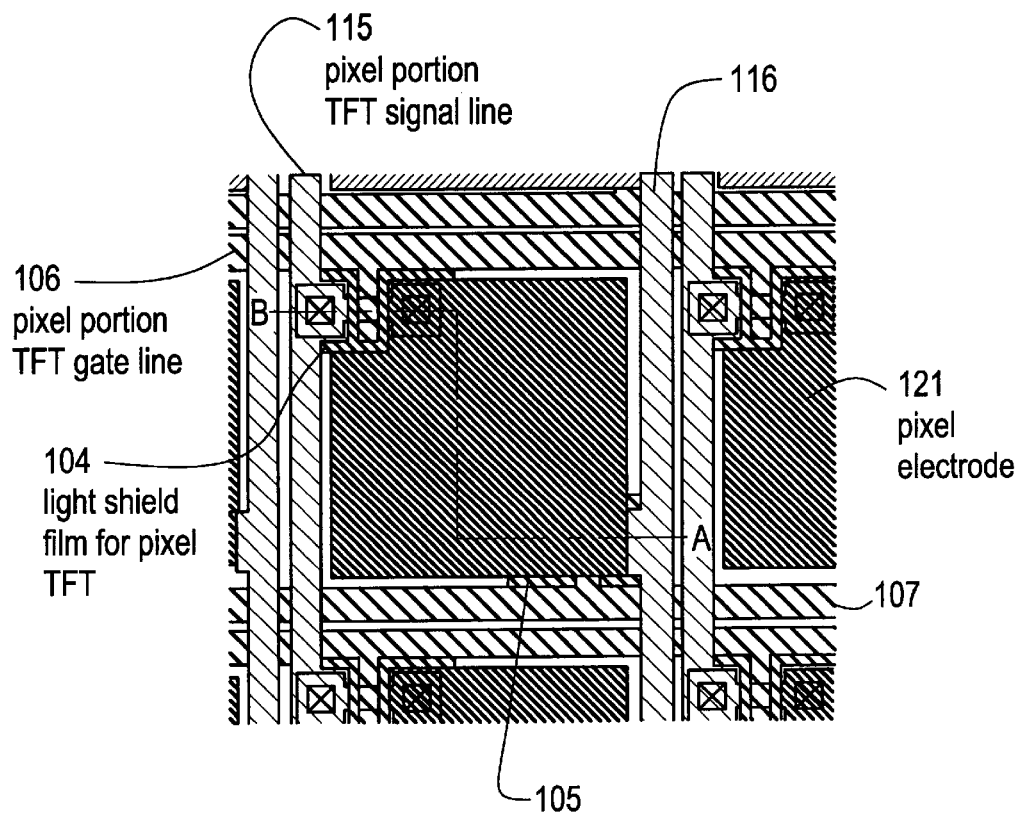
FIGS. 2A and 2B are views showing an example of front surface arrangement and back surface arrangement of one pixel.
Figure 2B:
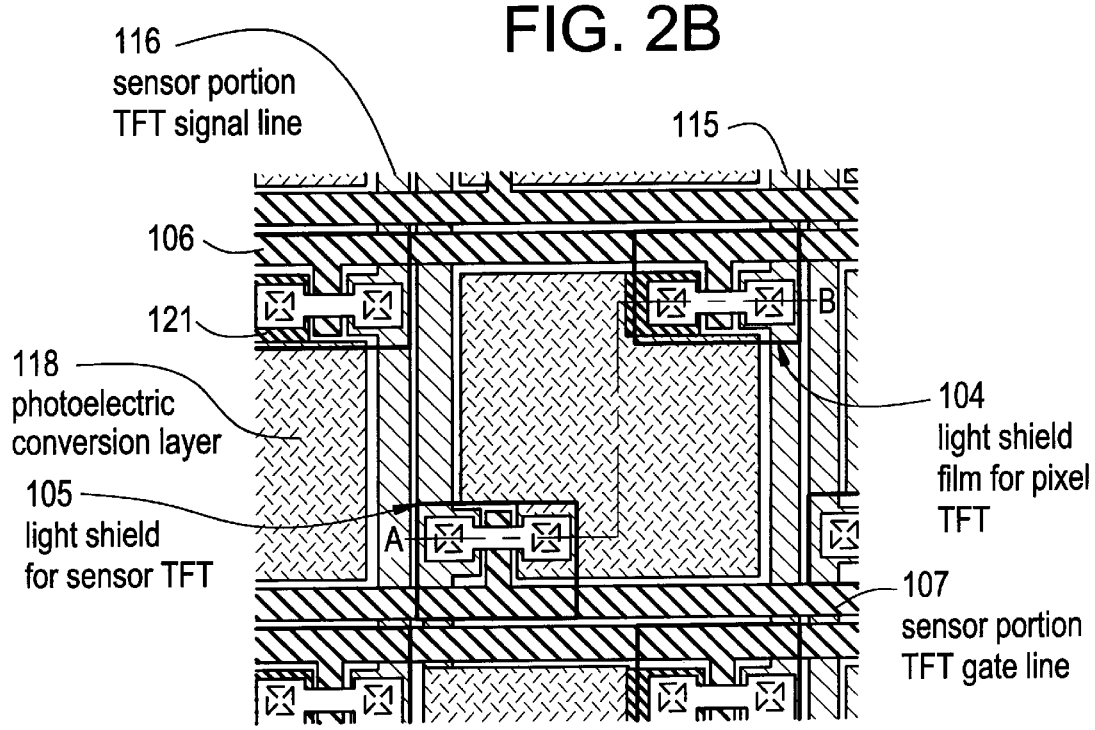

FIG. 1 is a sectional view of one pixel making up the display portion and sensor portion 402 in FIG. 4, and FIGS. 2A and 2B are views showing an example of an arrangement using such an element.

FIG. 2A indicates a surface top view and a sectional view taken along A–B corresponds to FIG. 1. In FIG. 2A, the sensor portion is covered with a reflective electrode 121. In FIG. 2A, such a structure is adopted that the reflective electrode 121 is not formed on wiring lines 106, 107, 115 and 116. The liquid crystal display is made by using this reflective electrode 121. Wiring lines concerned in the liquid crystal display are the pixel portion TFT signal line 115 and the pixel portion TFT gate line 106.

FIG. 2B shows the back surface of FIG. 2A. Actually, since protective shading (light shielding) films 104 and 105 for a TFT are formed, although a TFT portion can not be observed, for convenience, only forming portions of the shading films 104 and 105 are shown in the drawing. In addition, although a photoelectric conversion layer 118 may be formed on the wiring lines 106, 107, 115, and 116 and a pixel TFT, FIG. 2B shows a structure in which the photoelectric conversion layer 118 is not formed. A light signal incident on the photoelectric conversion layer is read, and data are transmitted to the sensor portion TFT signal line 116. Here, wiring lines concerned in picture reading are the sensor portion TFT signal line 116 and the sensor portion TFT gate line 107.

That is, as shown in FIG. 1 or FIGS. 2A and 2B, since the present invention is constructed such that one pixel includes two TFTs, the pitch of pixels and the number of bits become the same between the light receiving matrix and the display matrix. The shading film 104 is provided on the substrate 100 at a display element side, so that such a structure is adopted that the TFT is protected against light incident from the back surface. Moreover, such a structure may be adopted that the shading film 105 may be provided on the TFT at a sensor element side. Moreover, such a structure may be adopted that the shading film may be directly provided on the back surface of the substrate.

After an under film 101 is formed on the shading films 104 and 105, a plurality of TFTs for displaying or reading pictures are formed. The back surface of the substrate here indicates a substrate surface on which a TFT is not formed. The structure of the TFT may be a top gate type or a bottom gate type.

Then a transparent conductive film 117 connected to a drain electrode 112 of the TFT at the sensor element side is provided. This conductive film is a film forming a lower electrode of a photoelectric conversion element, and is formed on a pixel region other than the upper portion of the TFT of the display element. A photoelectric conversion layer is provided on the conductive film, and an upper electrode 119 is further provided thereon, so that a photoelectric conversion element is completed.

On the other hand, with respect to the TFT at the display element side, a pixel reflective electrode 121 connected to a drain wiring line 114 is provided. Such a structure may be adopted that the pixel reflective electrode covers the sensor portion and a wiring line. In the case where the structure of covering the wiring line is adopted, capacitance is formed with a dielectric of an insulating film existing between the wiring line and the pixel reflective electrode. Since the present invention relates to a reflection type display, a metal material having reflectivity is used as the pixel electrode.

A manufacturing process of the present invention is substantially the same as manufacturing steps of a conventional display device except manufacturing steps of a photoelectric conversion element. Thus, since a conventional manufacturing process can be used, the device can be manufactured easily and at low cost. Moreover, even if a sensor function is included, the shape and size of the device manufactured through the present invention are not changed from a conventional panel. Thus, its size can be made small and its weight can be made light.

Although the present invention will be described below in more detail with respect to the preferred embodiments, it is needless to say that the present invention is not limited to these embodiments.

[Embodiment 1]

In this embodiment, an example of manufacturing steps of a liquid crystal panel having a sensor portion receiving light from a back surface of a liquid crystal display surface will be described in detail with reference to FIGS. 5A to 5D and FIGS. 6A to 6C.

First, an under film 101 is formed on the entire surface of a transparent substrate 100. As the transparent substrate 100, a glass substrate or a quartz substrate having transparency may be used. As the under film, a silicon oxide film with a thickness of 150 nm was formed by a plasma CVD method. In this embodiment, prior to this step of forming the under film, there were provided a shading film 104 for protecting a display pixel portion TFT against light from the back surface, and a shading film 104 for protecting a light receiving sensor portion TFT against light from the back surface. In this embodiment, although the shading films are provided to prevent noise and deterioration, it is not particularly necessary to provide them if an opening rate is prioritized.

Next, an amorphous silicon film with a thickness of 30 to 100 nm, preferably 30 nm was formed by a plasma CVD method, and a polycrystal silicon film was formed by irradiation of excimer laser light. As the method of crystallizing the amorphous silicon film, a thermal crystallizing method called an SPC, an RTA method using irradiation of infrared rays, a method of using thermal crystallization and laser annealing, and the like may be used.

Figure 5A:
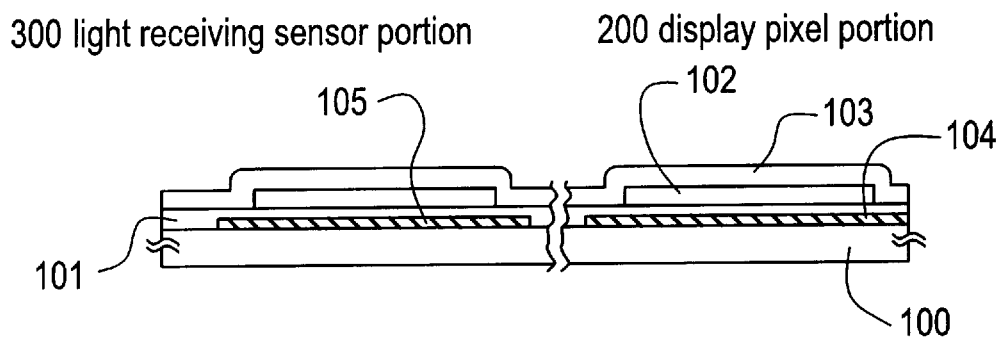
FIGS. 5A to 5D are views showing steps of forming a sensor portion and a display element on one pixel.

Next, the polycrystal silicon film is patterned to form island-like semiconductor layer 102 for making source regions, drain regions, channel formation regions of TFTs 200 and 300. Then a gate insulating film 103 covering these semiconductor layers is formed. The gate insulating film with a thickness of 100 nm is formed by a plasma CVD method using silane (SiH$_4$) and N$_2$O as a raw material gas (FIG. 5A).

Next, a conductive film is formed. Here, although aluminum was used as a conductive film material, a film mainly containing titanium, silicon, or a lamination film of those films may be used. In this embodiment, the aluminum film with a thickness of 200 to 500 nm, typically 300 nm is formed by a sputtering method. For the purpose of suppressing generation of hillocks or whiskers, scandium (Sc), titanium (Ti), or yttrium (Y) of 0.04 to 1.0 wt % is made to be contained in the aluminum film.

Next, a resist mask is formed, and the aluminum film is patterned to form an electrode pattern, so that a pixel gate electrode 106 and a sensor portion gate electrode 107 are formed.

Figure 5B:
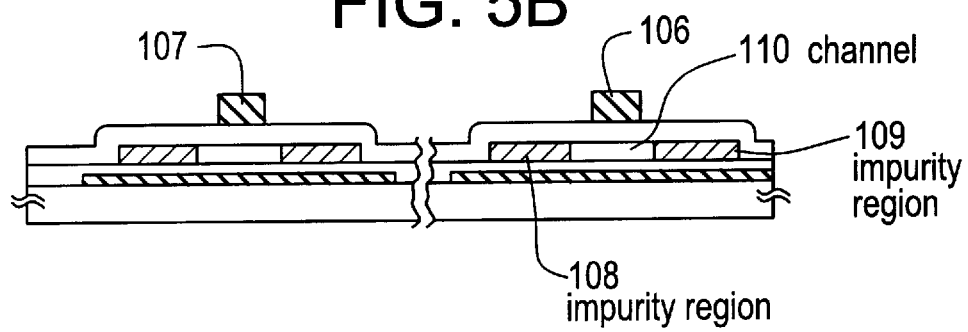

Next, an offset structure is formed by a well-known method. Further, an LDD structure may be formed by a well-known method (FIG. 5B).

Then a first interlayer insulating film 113 is formed, and contact holes reaching N-type high concentration impurity regions (source region, drain region) are formed. Thereafter, a metal film is formed and is patterned to form wiring lines 112, 114, 115, and 116.

In this embodiment, the first interlayer insulating film 113 is formed of a silicon nitride film with a thickness of 500 nm. As the first interlayer insulating film, a silicon oxide film or a silicon nitride oxide film may be used other than the silicon nitride film. Moreover, a multilayer film of these insulating films may be used.

As the metal film of a starting film of the wiring lines, in this embodiment, a lamination film made of a titanium film, an aluminum film, and a titanium film is formed by a sputtering method. The thicknesses of these films are 100 nm, 300 nm, and 100 nm, respectively.

Figure 5C:
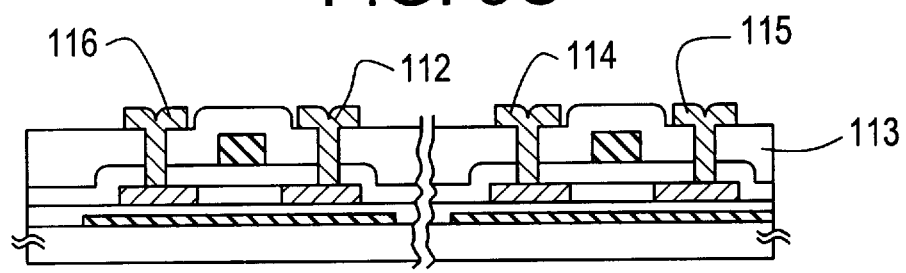

Through the foregoing process, the pixel TFT 200 and the light receiving portion TFT 300 are completed at the same time (FIG. 5C).

Next, a transparent conductive film being in contact with the drain wiring line 112 of the light receiving portion TFT is formed on the first interlayer insulating film 113. The transparent conductive film is formed and is patterned, so that a transparent electrode 117 of a photoelectric conversion element is formed. ITO or SnO$_2$ may be used for the transparent conductive film 117. In this embodiment, an ITO film with a thickness of 100 nm is formed as the transparent conductive film.

Figure 5D:
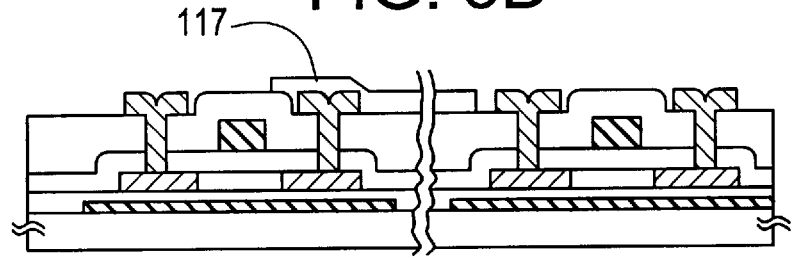

While an upper electrode is formed of a transparent conductive film in a general active type image sensor, the image sensor of this embodiment is different from the general image sensor in that a lower electrode is formed of the transparent conductive film. In this invention, since light is received from the back surface, the lower electrode is formed of the transparent conductive film (FIG. 5D).

Next, an amorphous silicon film 118 containing hydrogen (hereinafter referred to as a-Si:H film) functioning as a photoelectric conversion layer is formed on the entire surface of the substrate. Then patterning is carried out so that the a-Si:H film remains at only a light receiving portion to form the photoelectric conversion layer.

Figure 6A:
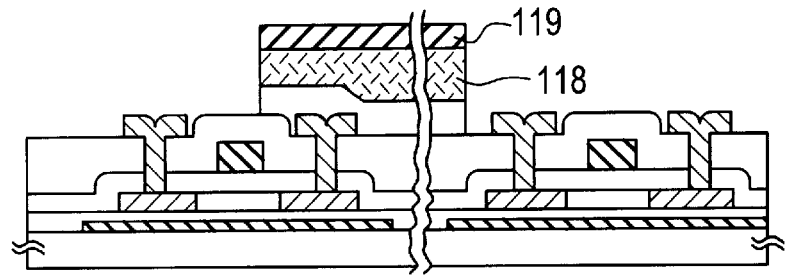
FIGS. 6A to 6C are views showing steps of forming a sensor portion and a display element on one pixel.

Next, a conductive film is formed on the entire surface of the substrate. In this embodiment, a titanium film with a thickness of 200 nm is formed as the conductive film by a sputtering method. This conductive film is patterned to form an upper electrode 119 connected to the light receiving portion TFT. Titanium or chromium may be used as the conductive film (FIG. 6A).

A light receiving effective portion of this sensor portion is a portion in one pixel, which is surrounded by the gate wiring lines 106 and 107 and the signal wiring lines 115 and 116 and in which the shading films 104 and 105 are not formed. The sizes of pixels in this embodiment are the same between the display portion and the sensor portion, and the size is made 60×60 $\mu$m. However, the size is not particularly limited as long as it is within the range of 16×16 $\mu$m to 70×70 $\mu$m.

Figure 6B:
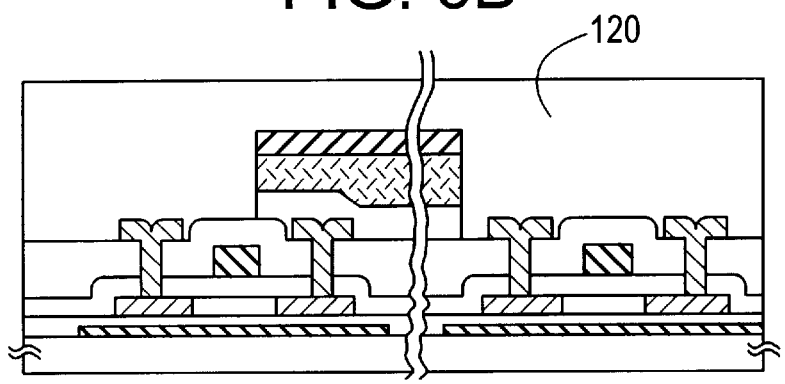

Then a second interlayer insulating film 120 is formed. When a resin film of polyimide, polyamide, polyimide amide, acryl, or the like is formed as an insulating film for forming the second interlayer insulating film, a flat surface can be obtained, so that such a resin film is preferable. Alternatively, a lamination layer structure may be adopted such that an upper layer of the second interlayer insulating film is the foregoing resin film, and a lower layer thereof is a single layer or multilayer film of inorganic insulating materials such as silicon oxide, silicon nitride, and silicon nitride oxide. In this embodiment, a polyimide film with a thickness of 0.7 $\mu$m was formed as the insulating film on the entire surface of the substrate (FIG. 6B).

Further, a contact hole reaching the drain wiring line 114 is formed in the second interlayer insulating film. A conductive film is again formed on the entire surface of the substrate, and is patterned to form a pixel electrode 121 connected to the pixel TFT. In this embodiment, a titanium film with a thickness of 200 nm is formed as the conductive film by a sputtering method. Titanium, chromium, or aluminum may be used for the conductive film.

Figure 6C:
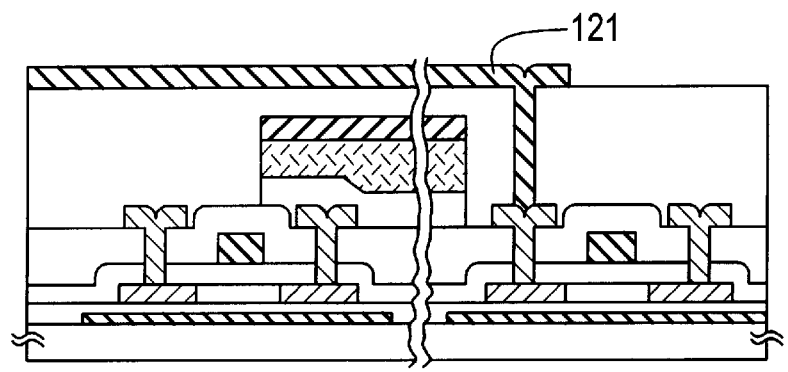

Through the foregoing steps, an element substrate as shown in FIG. 6C or FIG. 1 is completed.

Then this element substrate and an opposite substrate are bonded to each other through a seal material, and a liquid crystal is enclosed so that a reflection type liquid crystal panel is completed. The liquid crystal can be freely selected according to an operation mode (ECB mode, guest-host mode) of the liquid crystal. The opposite substrate is constructed such that a transparent conductive film and an oriented film are formed on a transparent substrate. Other than those, a black mask or a color filter may be provided as the need arises.

Subsequently, as shown in FIG. 4B, a color filter 411, an optical system 409, and a support 408 for fixing the optical system 409 are provided on the back surface of the liquid crystal panel, and the device is manufactured.

In this way, the liquid crystal panel having the sensor portion which receives light from the back surface of the liquid crystal display surface is completed. FIG. 3 is a circuit diagram of this embodiment simplified into 2×2 pixels for convenience. The most remarkable feature in this circuit diagram is that the liquid crystal display element and the sensor element are independent of each other.

The liquid crystal display element is mainly made up of a liquid crystal material 302, a capacitance 314, a pixel TFT 303, a gate line connected to a display gate driver 311, a display signal driver 310, a display input signal line 306, and a fixed potential line 304.

The sensor element is mainly made of a photodiode PD 301, a sensor TFT 312, an output signal line of a sensor, a sensor horizontal shift register 308, a sensor vertical shift register 309, and a fixed potential line 305.

[Embodiment 2]

In this embodiment, an example of manufacturing steps of a liquid crystal panel including a sensor portion receiving light from a back surface of a liquid crystal display surface will be described in detail with reference to FIGS. 8A to 8D and FIGS. 9A to 9C.

The feature of this embodiment is that one pixel includes a display pixel portion TFT and a light receiving sensor portion TFT, an interlayer insulating film covering these TFTs are formed, a photoelectric conversion layer is formed on the interlayer insulating film, and is connected to the light receiving sensor portion TFT. Thus, as compared with the embodiment 1, the opening rate is large.

First, an under film 701 is formed on the entire surface of a transparent substrate. A glass substrate or a quartz substrate may be used as a transparent substrate 700. A silicon oxide film with a thickness of 200 nm was formed as the under film by a plasma CVD method. In this embodiment, prior to the step of forming the under film, a shading film 704 for protecting the display pixel TFT portion against light from the back surface, and a shading film 706 for protecting the light receiving sensor TFT portion against light from the back surface were provided.

Next, an amorphous silicon film with a thickness of 30 to 100 nm, preferably, 30 nm was formed by a plasma CVD method, and a polycrystal silicon film is formed by irradiation of excimer laser light. As the method of crystallizing the amorphous silicon film, a thermal crystallizing method called an SPC, an RTA method using irradiation of infrared rays, a method of using thermal crystallization and laser annealing, and the like may be used.

Figure 8A:
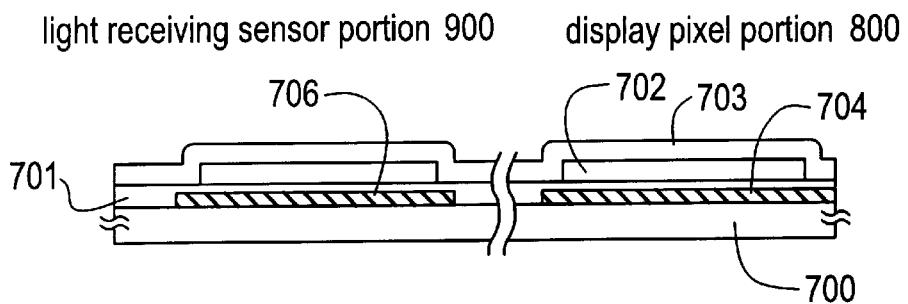
FIGS. 8A to 8D are views of manufacturing steps of the second embodiment.

Next, the polycrystal silicon film is patterned to form island-like semiconductor layers 702 for making source regions, drain regions, and channel formation regions of TFTs 800 and 900. Next, a gate insulating film 703 covering these semiconductor layers is formed. The gate insulating film with a thickness of 120 nm is formed by a plasma CVD method using silane (SiH$_4$) and N$_2$O as a raw material gas (FIG. 8A).

Next, a conductive film is formed. Here, although aluminum was used as a conductive film material, a film mainly containing titanium, silicon, or a lamination film of those films may be used. In this embodiment, the aluminum film with a thickness of 300 to 500 nm, typically 300 nm is formed by a sputtering method. For the purpose of suppressing the generation of hillocks or whiskers, scandium (Sc), titanium (Ti), or yttrium (Y) of 0.04 to 1.0 wt % is made to be contained in the aluminum film.

Next, a resist mask is formed, and the aluminum film is patterned to form an electrode pattern, so that gate electrodes 705 and 707 are formed.

Figure 8B:
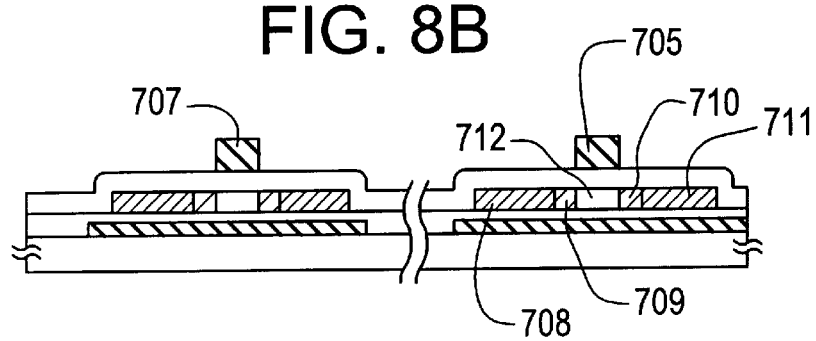

Next, LDD structures 709 and 710 are formed by a well-known method. Besides, an offset structure may be formed by a well-known method. Reference numerals 708 and 711 denote high concentration impurity regions, and 712 denotes a channel region (FIG. 8B).

Then a first interlayer insulating film 713 is formed, and contact holes reaching N-type high concentration impurity regions (source region, drain region) are formed. Thereafter, a metal film is formed and is patterned to form wiring lines 714, 715, 722, and 723.

In this embodiment, the first interlayer insulating film is formed of a silicon nitride film with a thickness of 500 nm. As the first interlayer insulating film, a silicon oxide film or a silicon nitride film may be used other than the silicon nitride oxide film. Moreover, a multilayer film of these insulating films may be used.

As the metal film of a starting film of the wiring electrodes 714, 715, 722, and 723, in this embodiment, a lamination film made of a titanium film, an aluminum film, and a titanium film is formed by a sputtering method. The thicknesses of these films are 100 nm, 300 nm, and 100 nm, respectively.

Figure 8C:
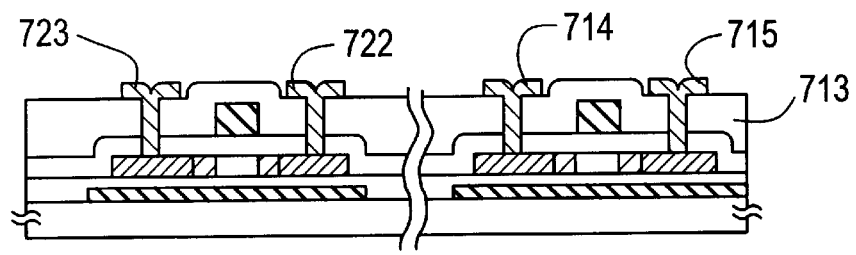

Through the foregoing process, the pixel TFT 800 and the light receiving portion TFT 900 are completed at the same time (FIG. 8C).

Next, a second interlayer insulating film 716 covering the TFTs is formed. The main point different from the embodiment 1 is that this second interlayer insulating film is provided so that a photoelectric conversion layer formed in a subsequent step can be widely formed. By doing so, a light receiving area (opening rate) of a sensor can be made wider than the embodiment 1. A resin film which cancels asperities of a lower layer so that a flat surface can be obtained, is preferable as the second interlayer insulating film. As such a resin film, polyimide, polyamide, polyimide amide, or acryl may be used. Alternatively, an upper layer of the second interlayer insulating film may be the foregoing resin film for the purpose of obtaining the flat surface, and a lower layer thereof may be a single layer or a multilayer of inorganic insulating material such as silicon oxide, silicon nitride, and silicon nitride oxide. In this embodiment, a polyimide film with a thickness of 1.5 μm is formed as the second interlayer insulating film.

Next, after a contact hole reaching the wiring line 723 of the light receiving portion TFT 900 is formed in the second interlayer insulating film 716, a transparent conductive film is formed. As the transparent conductive film, ITO or $SnO_2$ may be used. In this embodiment, an ITO film with a thickness of 120 nm is formed.

Figure 8D:
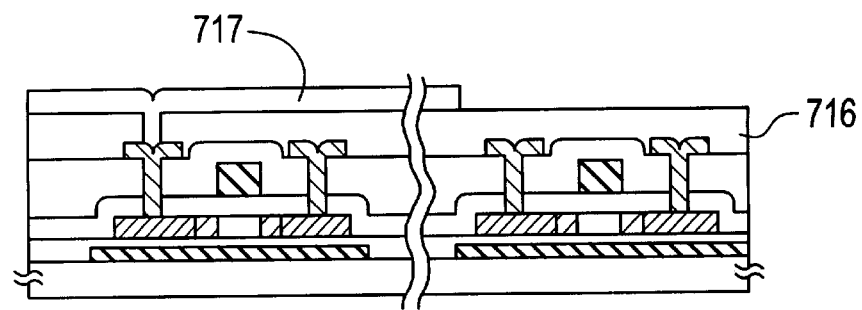

Next, the transparent conductive film is patterned to form a lower electrode 717 connected to the light receiving portion TFT 900 (FIG. 8D).

Next, an amorphous silicon film 718 containing hydrogen (hereinafter referred to as a-Si:H film) functioning as a photoelectric conversion layer is formed on the entire surface of the substrate. Then patterning is carried out so that the a-Si:H film remains at only a light receiving portion to form the photoelectric conversion layer.

Next, a conductive film is formed on the entire surface of the substrate. In this embodiment, a titanium film with a thickness of 200 nm is formed as the conductive film by a sputtering method. This conductive film is patterned to form an upper electrode 719 connected to the light receiving portion TFT. Titanium or chromium may be used for the conductive film.

Figure 9A:
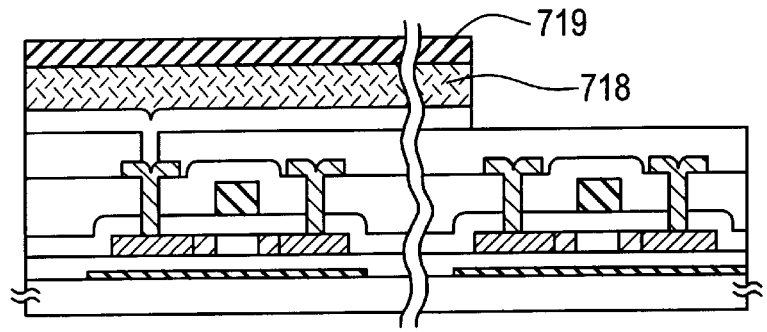
FIGS. 9A to 9C are views of manufacturing steps of the second embodiment.

While an upper electrode in a general active type image sensor is formed of a transparent electrode, the image sensor of this embodiment is different from the general image sensor in that a lower electrode thereof is formed of a transparent electrode. In this invention, since light is received from the back surface, the lower electrode is formed of a transparent conductive film (FIG. 9A).

Figure 9B:
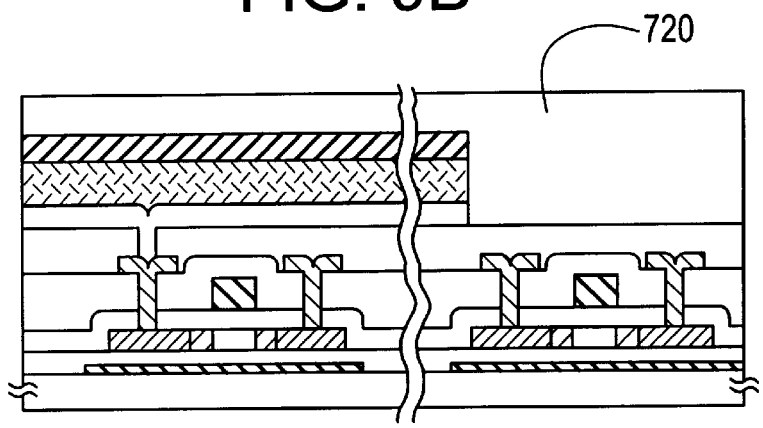

Then a third interlayer insulating film 720 is formed. If a resin film of polyimide, polyamide, polyimide amide, or acryl is used as an insulating film forming the third interlayer insulating film, a flat surface can be obtained, so that such a resin film is preferable. Alternatively, an upper layer of the third interlayer insulating film may be the foregoing resin film and a lower layer thereof may be a single layer or multilayer film of inorganic insulating material such as silicon oxide, silicon nitride, and silicon nitride oxide. In this embodiment, a polyimide film with a thickness of 0.5 μm was formed on the entire surface of the substrate (FIG. 9B).

The maximum process temperature of the present invention after the formation of the polyimide film is made a temperature lower than the heat resistance temperature 320° C. of this polyimide.

Further, a contact hole reaching the wiring line is formed in the third and second interlayer insulating films. A conductive film is again formed on the entire surface of the substrate, and is patterned to form a pixel electrode 721 connected to the pixel TFT. In this embodiment, a titanium film with a thickness of 200 nm is formed as the conductive film by a sputtering method. Titanium or chromium may be used for the conductive film.

Figure 7:
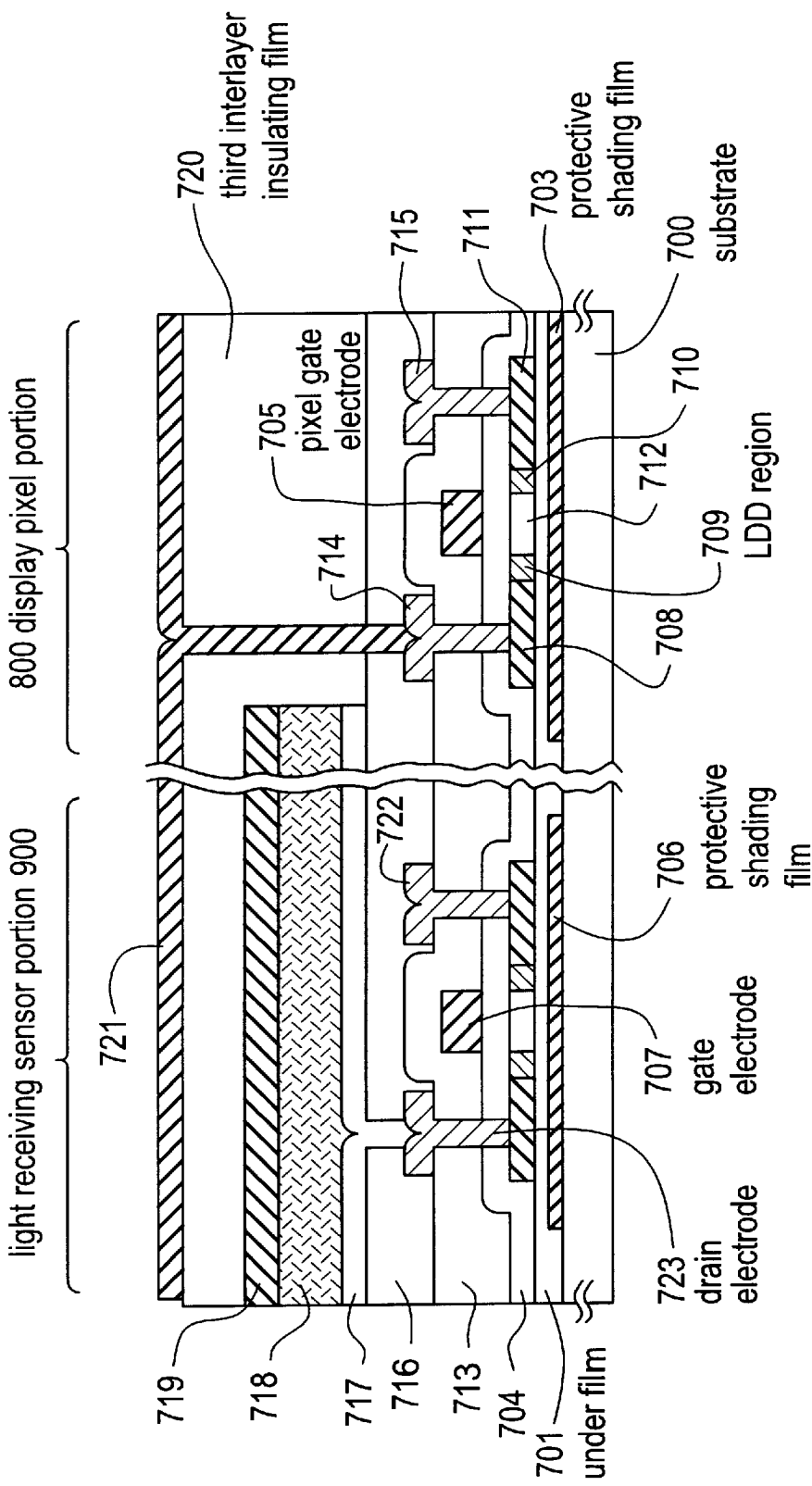
FIG. 7 is a sectional view of a pixel of a second embodiment.
Figure 9C:
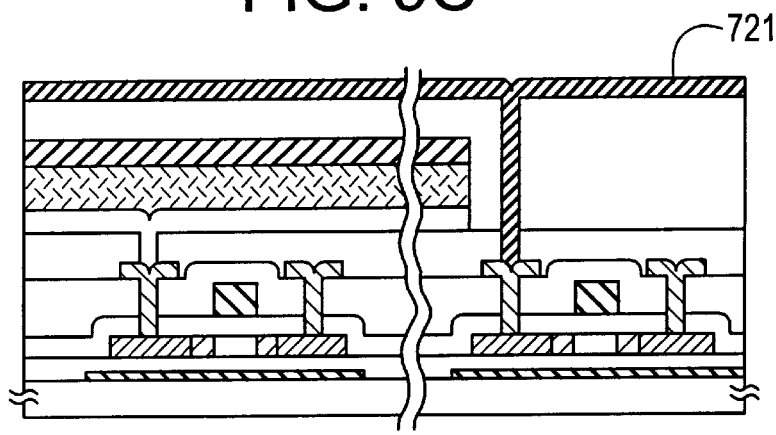

Through the foregoing steps, an element substrate as shown in FIG. 9C or FIG. 7 is completed.

Thereafter, similarly to the embodiment 1, the element substrate and an opposite substrate are bonded to each other through a seal material, and a liquid crystal is enclosed to complete a reflection type liquid crystal panel. A color filter 411, an optical system 409, and a support 408 for fixing the optical system 409 are provided on the back surface of the liquid crystal panel, and the device is manufactured.

In this way, the liquid crystal panel including the sensor portion receiving light from the back surface of the liquid crystal display surface is completed.

[Embodiment 3]

Although examples in which a non-amplifying image sensor is used, are shown in the embodiments 1 and 2, this embodiment relates to an amplifying type image sensor. More specifically, an example in which an image sensor including semiconductor devices disposed in matrix, will be described.

Figure 10:
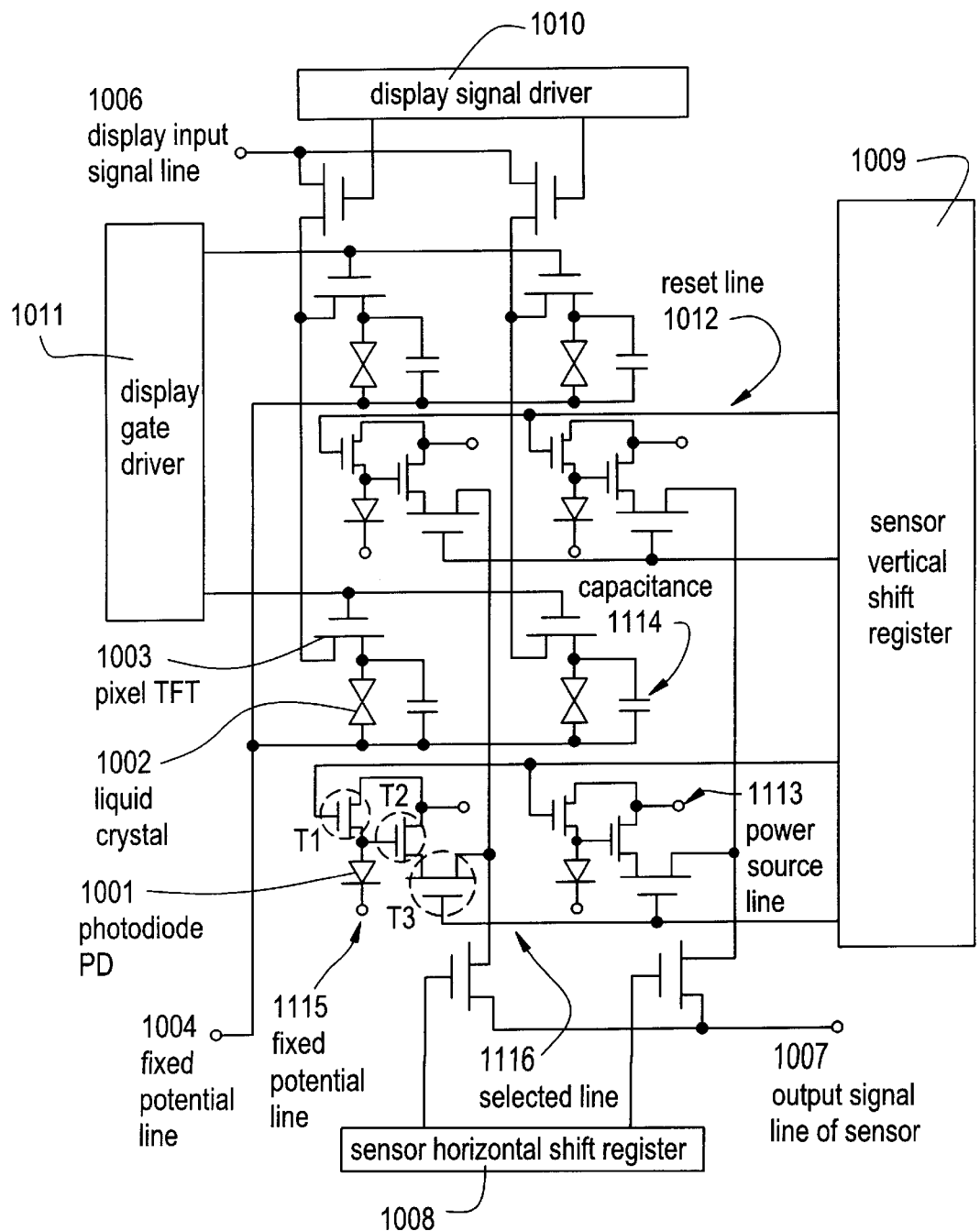
FIG. 10 is a circuit diagram of a third embodiment.

FIG. 10 is a simplified view of a circuit diagram of a liquid crystal panel using this amplifying type image sensor. The amplifying type image sensor uses three TFTs of a reset transistor $T_1$, an amplification transistor $T_2$, and a selection transistor $T_3$. The most remarkable feature in this circuit diagram is that this diagram includes a reset line 1012, a power source line 1113, a sensor vertical peripheral driving circuit 1009, a sensor horizontal peripheral driving circuit 1008, and a fixed potential line 1115.

Moreover, similarly to the embodiment 1 or 2, the feature of this embodiment is that the wiring line of the liquid crystal display element and the wiring line of the sensor element is independent of each other. The liquid crystal display element is made up of a liquid crystal 1002, a pixel TFT 1003, a capacitance 1114, a fixed potential line 1004, a gate line connected to a display gate driver 1011, a display signal driver 1010, and a display input signal line 1006.

While an upper electrode of a general active type image sensor is formed of a transparent electrode, the image sensor of this embodiment is different from the general image sensor in that a lower electrode thereof is formed of a transparent electrode.

With respect to the operation method of the image sensor of this embodiment, when a picture of one frame is detected, a reset pulse signal is inputted from the reset line 1012, and the reset transistor $T_1$ with a gate connected to the reset line is turned on. Then the potential of an upper electrode of a photodiode and an amplification transistor is reset to a power source potential. When the reset transistor $T_1$ is in an off state, the gate electrode of the amplification transistor $T_2$ is put in a floating state. In this state, light incident on the photo diode PD 1001 is converted into an electric charge and is stored. By this electric charge, the potential of the upper electrode of the photodiode is slightly changed from the power source potential. The change of this potential is detected as a potential variation of the gate electrode of the amplification transistor $T_2$, and a drain current of the amplification transistor $T_2$ is amplified. When a selection pulse signal is inputted from a selection line 1116 is inputted, the selection transistor $T_3$ is turned on, and an electric current amplified by the amplification transistor $T_2$ is outputted as a picture signal to a signal line 1007.

[Embodiment 4]

In this embodiment, an example of a device provided with an integral-type liquid crystal display panel having an image sensor function as described in the embodiments 1 to 3 will be described.

Figure 11A:
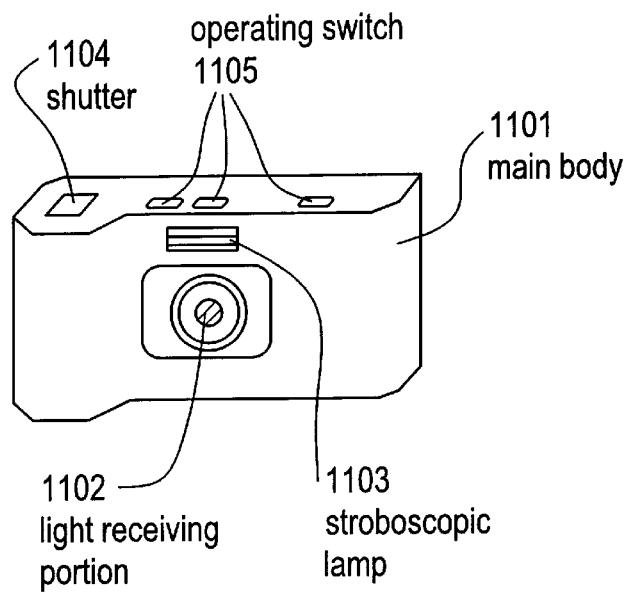
FIGS. 11A to 11D show an applied examples of the present invention.
Figure 11B:
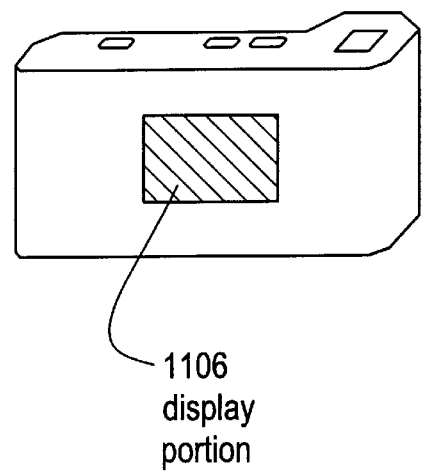

Here, a digital still camera as shown in FIGS. 11A and 11B will be described. FIGS. 11A and 11B show cases in which angles of viewing are different from each other by 180 degrees.

The structure shown in FIGS. 11A and 11B includes a main body 1101, a display portion 1106, a light receiving portion 1102 which is disposed on the back surface of the main body and in which an image sensor is disposed, an operation switch 1105, a shutter 1104, and a stroboscopic lamp 1103.

An image sensed by the image sensor of the light receiving portion 1102 is subjected to signal processing, and a still picture or a moving picture is displayed in realtime or is taken in a memory.

Figure 11C:
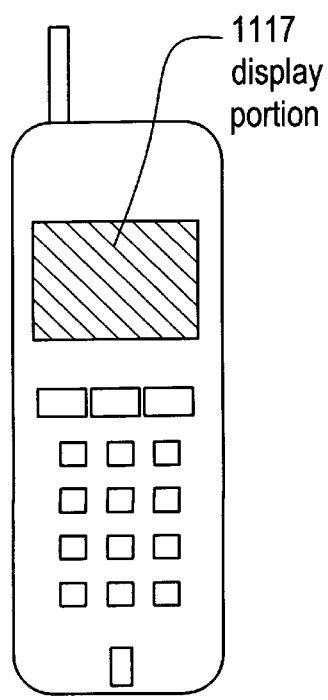
Figure 11D:
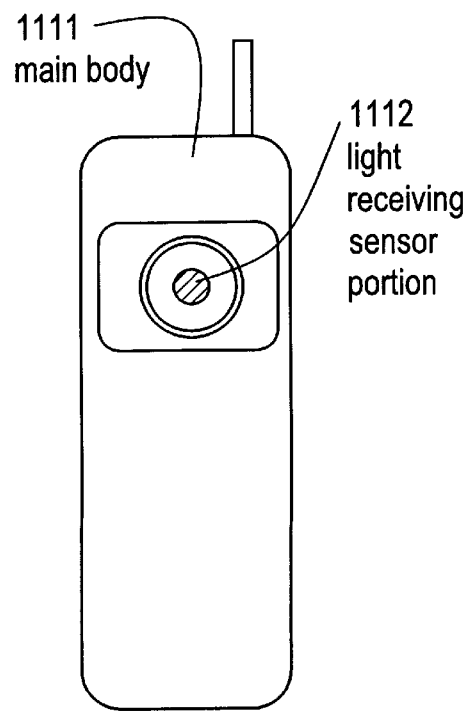

Moreover, here, a portable telephone having a sensor function as shown in FIGS. 11C and 11D will be described. FIGS. 11C and 11D show cases in which viewing angles are different from each other by 180 degrees.

The structure shown in FIGS. 11C and 11D includes a main body 1111, a display portion 1117, a light receiving portion 1112 which is disposed on the back surface of the main body and in which an image sensor is disposed, and an operation switch.

An image sensed by the image sensor of the light receiving portion 1112 is subjected to signal processing, and a still picture or a moving picture is displayed by the display portion 1117 in realtime. Also picture data are received from a communicating partner and are displayed. Further, such a structure may be adopted that picture data sensed by the image sensor of the light receiving portion 11 12 are taken in the memory and are transmitted to a communicating partner.

The manufacturing process of the present invention is the same as that of a conventional display device other than the manufacturing steps of the photoelectric conversion element. Thus, since a conventional manufacturing process can be used, the device can be easily and inexpensively manufactured. Further, even if a sensor function is included, the shape and size of the substrate of the device manufactured by the present invention are not changed from a conventional panel. Thus, the size of the device can be made small and the weight thereof can be made light.

Moreover, since a light receiving area of a sensor cell is substantially the same as a pixel area of a display cell, and is large as compared with a single crystal CCD, the sensor of the present invention can be made supersensitive. Further, electric power consumed in this structure is small, and electric power consumed in the image sensor can also be made small as compared with a CCD structure.

What is claimed is:

1. An electronic device having at least one liquid crystal panel, said panel comprising:
   a transparent substrate having at least one pixel;
   a first thin film transistor and a second thin film transistor disposed in said at least one pixel;
   a first interlayer insulating film covering said first and second thin film transistors;
   a photoelectric conversion element formed on said first interlayer insulating film and electrically connected to said first thin film transistor through said first interlayer insulating film wherein said photoelectric conversion element comprises a first transparent electrode formed on said first interlayer insulating film, a photosensitive semiconductor film formed on the first transparent electrode, and a second light reflective electrode formed on the photosensitive semiconductor film;,
   a second interlayer insulating film formed over said first interlayer insulating film and said photoelectric conversion element; and
   a light reflective pixel electrode formed on said second interlayer insulating film and electrically connected to said second thin film transistor.

2. An electronic device according to claim 1 wherein said first and second thin film transistors are formed in a same level.

3. An electronic device according to claim 1 wherein said first and second thin film transistors have a same cross sectional structure.

4. An electronic device according to claim 1 wherein said photoelectric conversion element is located under said light reflective pixel electrode.

5. An electronic device according to claim 1 wherein said electronic device is a still camera.

6. An electronic device according to claim 1 wherein said electronic device is a portable phone.

7. An electronic device having at least one active matrix display panel, said panel comprising:
   a transparent substrate having at least one pixel;
   a first thin film transistor and a second thin film transistor disposed in said at least one pixel;
   a first interlayer insulating film covering said first and second thin film transistors;
   a photoelectric conversion element formed on said first interlayer insulating film and electrically connected to said first thin film transistor through said first interlayer insulating film wherein said photoelectric conversion element comprises a first transparent electrode formed on said first interlayer insulating film, a photosensitive semiconductor film formed on the first transparent electrode, and a second light reflective electrode formed on the photosensitive semiconductor film;
   a second interlayer insulating film formed over said first interlayer insulating film and said photoelectric conversion element; and
   a light reflective pixel electrode formed on said second interlayer insulating film and electrically connected to said second thin film transistor.

8. An electronic device according to claim 7 wherein said first and second thin film transistors are formed in a same level.

9. An electronic device according to claim 7 wherein said first and second thin film transistors have a same cross sectional structure.

10. An electronic device according to claim 7 wherein said photoelectric conversion element is located under said light reflective pixel electrode.

11. An electronic device according to claim 7 wherein said electronic device is a still camera.

12. An electronic device according to claim 7 wherein said electronic device is a portable phone.

13. An electronic device having at least one active matrix display panel, said panel comprising:
    a transparent substrate having at least one pixel;
    a first thin film transistor and a second thin film transistor disposed in said at least one pixel wherein light shielding films are disposed between said transparent substrate and said first and second thin film transistors;
    a first interlayer insulating film covering said first and second thin film transistors;
    a photoelectric conversion element formed on said first interlayer insulating film and electrically connected to said first thin film transistor through said first interlayer insulating film wherein said photoelectric conversion element comprises a first transparent electrode formed on said first interlayer insulating film, a photosensitive semiconductor film formed on the first transparent electrode, and a second light reflective electrode formed on the photosensitive semiconductor film;

a second interlayer insulating film formed over said first interlayer insulating film and said photoelectric conversion element; and a light reflective pixel electrode formed on said second interlayer insulating film and electrically connected to said second thin film transistor.

14. An electronic device according to claim 13 wherein said first and second thin film transistors are formed in a same level.

15. An electronic device according to claim 13 wherein said first and second thin film transistors have a same cross sectional structure.

16. An electronic device according to claim 13 wherein said photoelectric conversion element is located under said light reflective pixel electrode.

17. An electronic device according to claim 13 wherein said electronic device is a still camera.

18. An electronic device according to claim 13 wherein said electronic device is a portable phone.

19. An electronic device according to claim 13 wherein said display panel is a liquid crystal display panel.

20. An electronic device having at least one active matrix display panel, said panel comprising:

a transparent substrate having at least one pixel;

a first thin film transistor and a second thin film transistor disposed in said at least one pixel;

a first interlayer insulating film covering said first and second thin film transistors;

a photoelectric conversion element formed on said first interlayer insulating film and electrically connected to said first thin film transistor through said first interlayer insulating film wherein said photoelectric conversion element comprises a first transparent electrode formed on said first interlayer insulating film, a photosensitive semiconductor film formed on the first transparent electrode, and a second light reflective electrode formed on the photosensitive semiconductor film;

a second interlayer insulating film comprising an organic resin film formed over said first interlayer insulating film and said photoelectric conversion element wherein said second interlayer insulating film has a leveled upper surface; and a light reflective pixel electrode formed on said second interlayer insulating film and electrically connected to said second thin film transistor.

21. An electronic device according to claim 20 wherein said first and second thin film transistors are formed in a same level.

22. An electronic device according to claim 20 wherein said first and second thin film transistors have a same cross sectional structure.

23. An electronic device according to claim 20 wherein said photoelectric conversion element is located under said light reflective pixel electrode.

24. An electronic device according to claim 20 wherein said electronic device is a still camera.

25. An electronic device according to claim 20 wherein said electronic device is a portable phone.

26. An electronic device according to claim 20 wherein said display panel is a liquid crystal display panel.

27. An electronic device having at least one active matrix display panel, said panel comprising:

a transparent substrate having at least one pixel;

a first thin film transistor and a second thin film transistor disposed in said at least one pixel;

a first interlayer insulating film covering said first and second thin film transistors wherein said first interlayer insulating film comprises an organic resin film to provide a leveled upper surface thereon;

a photoelectric conversion element formed on said first interlayer insulating film and electrically connected to said first thin film transistor through said first interlayer insulating film wherein said photoelectric conversion element comprises a first transparent electrode formed on said first interlayer insulating film, a photosensitive semiconductor film formed on the first transparent electrode, and a second light reflective electrode formed on the photosensitive semiconductor film;

a second interlayer insulating film formed over said first interlayer insulating film and said photoelectric conversion element; and a light reflective pixel electrode formed on said second interlayer insulating film and electrically connected to said second thin film transistor.

28. An electronic device according to claim 27 wherein said first and second thin film transistors are formed in a same level.

29. An electronic device according to claim 27 wherein said first and second thin film transistors have a same cross sectional structure.

30. An electronic device according to claim 27 wherein said photoelectric conversion element is located under said light reflective pixel electrode.

31. An electronic device according to claim 27 wherein said electronic device is a still camera.

32. An electronic device according to claim 27 wherein said electronic device is a portable phone.

33. An electronic device according to claim 27 wherein said display panel is a liquid crystal display panel.

34. An electronic device having at least one active matrix display panel, said panel comprising:

a substrate having at least one pixel;

a first thin film transistor and a second thin film transistor disposed in said at least one pixel;

a first interlayer insulating film covering said first and second thin film transistors;

a photoelectric conversion element formed on said first interlayer insulating film and electrically connected to said first thin film transistor through said first interlayer insulating film wherein said photoelectric conversion element comprises a first electrode formed on said first interlayer insulating film, a photosensitive semiconductor film formed on the first electrode, and a second electrode formed on the photosensitive semiconductor film;

a second interlayer insulating film formed over said first interlayer insulating film and said photoelectric conversion element; and a pixel electrode formed on said second interlayer insulating film and electrically connected to said second thin film transistor.

35. An electronic device according to claim 34 wherein said first and second thin film transistors are formed in a same level.

36. An electronic device according to claim 34 wherein said first and second thin film transistors have a same cross sectional structure.

37. An electronic device according to claim 34 wherein said photoelectric conversion element is located under said pixel electrode.

38. An electronic device according to claim 34 wherein said electronic device is a still camera.

39. An electronic device according to claim 34 wherein said electronic device is a portable phone.

40. An electronic device having at least one active matrix display panel, said panel comprising:

a substrate having at least one pixel;

a first thin film transistor and a second thin film transistor disposed in said at least one pixel;

a first interlayer insulating film covering said first and second thin film transistors;

a photoelectric conversion element formed on said first interlayer insulating film and electrically connected to said first thin film transistor through said first interlayer insulating film wherein said photoelectric conversion element comprises a first electrode formed on said first interlayer insulating film, a photosensitive semiconductor film formed on the first electrode, and a second electrode formed on the photosensitive semiconductor film;

a second interlayer insulating film comprising an organic resin film formed over said first interlayer insulating film and said photoelectric conversion element wherein said second interlayer insulating film has a leveled upper surface; and a pixel electrode formed on said second interlayer insulating film and electrically connected to said second thin film transistor.

41. An electronic device according to claim 40 wherein said first and second thin film transistors are formed in a same level.

42. An electronic device according to claim 40 wherein said first and second thin film transistors have a same cross sectional structure.

43. An electronic device according to claim 40 wherein said photoelectric conversion element is located under said pixel electrode.

44. An electronic device according to claim 40 wherein said electronic device is a still camera.

45. An electronic device according to claim 40 wherein said electronic device is a portable phone.

46. An electronic device according to claim 40 wherein said display panel is a liquid crystal display panel.

47. An electronic device having at least one active matrix display panel, said panel comprising:

a transparent substrate having at least one pixel;

a first thin film transistor and a second thin film transistor disposed in said at least one pixel;

a photoelectric conversion element formed over said substrate and electrically connected to said first thin film transistor wherein said photoelectric conversion element comprises a first transparent electrode, a photosensitive semiconductor film formed on the first transparent electrode, and a second light reflective electrode formed on the photosensitive semiconductor film so that light entered through said transparent substrate is received by said photoelectric conversion element;

an interlayer insulating film formed over said photoelectric conversion element, and said first and second thin film transistors; and a light reflective pixel electrode formed on said interlayer insulating film and electrically connected to said second thin film transistor.

48. An electronic device according to claim 47 wherein said first and second thin film transistors are formed in a same level.

49. An electronic device according to claim 47 wherein said first and second thin film transistors have a same cross sectional structure.

50. An electronic device according to claim 47 wherein said photoelectric conversion element is located under said light reflective pixel electrode.

51. An electronic device according to claim 47 wherein said electronic device is a still camera.

52. An electronic device according to claim 47 wherein said electronic device is a portable phone.

53. An electronic device according to claim 47 wherein said insulating film comprises an organic resin film having a leveled upper surface.

* * * * *